(12) United States Patent
LeBlanc

(10) Patent No.: US 8,219,844 B1
(45) Date of Patent: Jul. 10, 2012

(54) METHODS AND SYSTEMS FOR EMULATING A SYNCHRONOUS CLEAR PORT

(75) Inventor: Marcel A. LeBlanc, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 438 days.

(21) Appl. No.: 12/534,788

(22) Filed: Aug. 3, 2009

(51) Int. Cl.
*G06F 1/04* (2006.01)

(52) U.S. Cl. ........................................ 713/401; 713/400

(58) Field of Classification Search ......................... None
See application file for complete search history.

(56) References Cited

U.S. PATENT DOCUMENTS

| | | | |
|---|---|---|---|
| 5,003,204 A * | 3/1991 | Cushing et al. | 326/40 |
| 6,872,601 B1 | 3/2005 | Baxter et al. | |
| 6,987,401 B1 | 1/2006 | Langhammer et al. | |
| 7,424,689 B1 | 9/2008 | Yuan | |
| 7,626,420 B1 * | 12/2009 | Cohen | 326/46 |
| 2005/0036577 A1 * | 2/2005 | Sweet | 375/354 |
| 2007/0252617 A1 * | 11/2007 | Lewis et al. | 326/41 |
| 2008/0238476 A1 | 10/2008 | Lewis et al. | |

* cited by examiner

*Primary Examiner* — Dennis M Butler
(74) *Attorney, Agent, or Firm* — Weaver Austin Villeneuve & Sampson LLP

(57) ABSTRACT

A synchronous clear emulation circuit is provided. The synchronous clear emulation circuit includes a register having an asynchronous clear port. Moreover, the synchronous clear emulation circuit is configured to emulate a synchronous clear port by using the asynchronous clear port. The synchronous clear port is emulated by outputting a data output signal that is synchronous with the clock signal and the data output signal is based on an asynchronous clear signal received at the asynchronous clear port. The asynchronous clear port performs a function of the asynchronous clear port without the synchronous clear port implemented within the register.

23 Claims, 8 Drawing Sheets

METHODS AND SYSTEMS FOR EMULATING A SYNCHRONOUS CLEAR PORT

FIELD OF THE INVENTION

The present disclosure generally relates to integrated circuits and other devices of that general type. More particularly, the present disclosure relates to methods and systems for emulating a synchronous clear port of a register within an integrated circuit, such as a programmable logic device (PLD), a structured application specific integrated circuit (ASIC), or a gate array.

BACKGROUND

There are a wide variety of integrated circuits known as programmable logic devices (PLDs), field programmable gate arrays (FPGAs), and application specific integrated circuits (ASICs). The integrated circuits are typically made up of input/output (I/O) resources, interconnect resources, logic resources, and memory resources. The integrated circuits may also contain other resources, such as digital signal processing blocks ("DSPs") and other embedded processing resources. The logic resources typically include logic elements (LEs) grouped in clusters that are sometimes referred to as logic array blocks (LABs). The memory resources typically include embedded memory blocks (EMBs) of various sizes.

Some integrated circuits include a set of registers that include hardware providing a certain set of functions. However, the registers do not provide other functions without specifically incorporating hardware within the registers to perform the other functions.

A clock source supplies a clock signal to an integrated circuit. However, based on a configuration of the integrated circuit, a clock skew may skew the clock signal. As a result of the clock skew, a static timing analysis used in developing the integrated circuit generates inaccurate results.

SUMMARY OF THE INVENTION

A synchronous clear emulation circuit is provided. The synchronous clear emulation circuit includes a register having an asynchronous clear port. Moreover, the synchronous clear emulation circuit is configured to emulate a synchronous clear port by using the asynchronous clear port. The synchronous clear port is emulated by outputting a data output signal that is synchronous with the clock signal and the data output signal is based on an asynchronous clear signal received at the asynchronous clear port. Accordingly, the asynchronous clear port functions as the synchronous clear port without the synchronous clear port implemented within the register.

The synchronous clear emulation circuit includes a clock follower circuit that does not gate the clock signal. The clock follower circuit does not gate the clock signal by using a register that receives the clock signal instead of using a two-input gate to receive the clock signal. Accordingly, chances of creation of clock skew by using the two-input gate are reduced compared to those field programmable gate arrays (FPGAs) that use a gated clock signal. Further, any clock skew has lesser impact on performance of an integrated circuit that does not gate the clock signal compared to those FPGAs that use the gated clock signal.

BRIEF DESCRIPTION OF THE DRAWINGS

The systems and techniques may best be understood by reference to the following description taken in conjunction with the accompanying drawings, which illustrate specific embodiments of the present invention.

DETAILED DESCRIPTION

Figure 1:
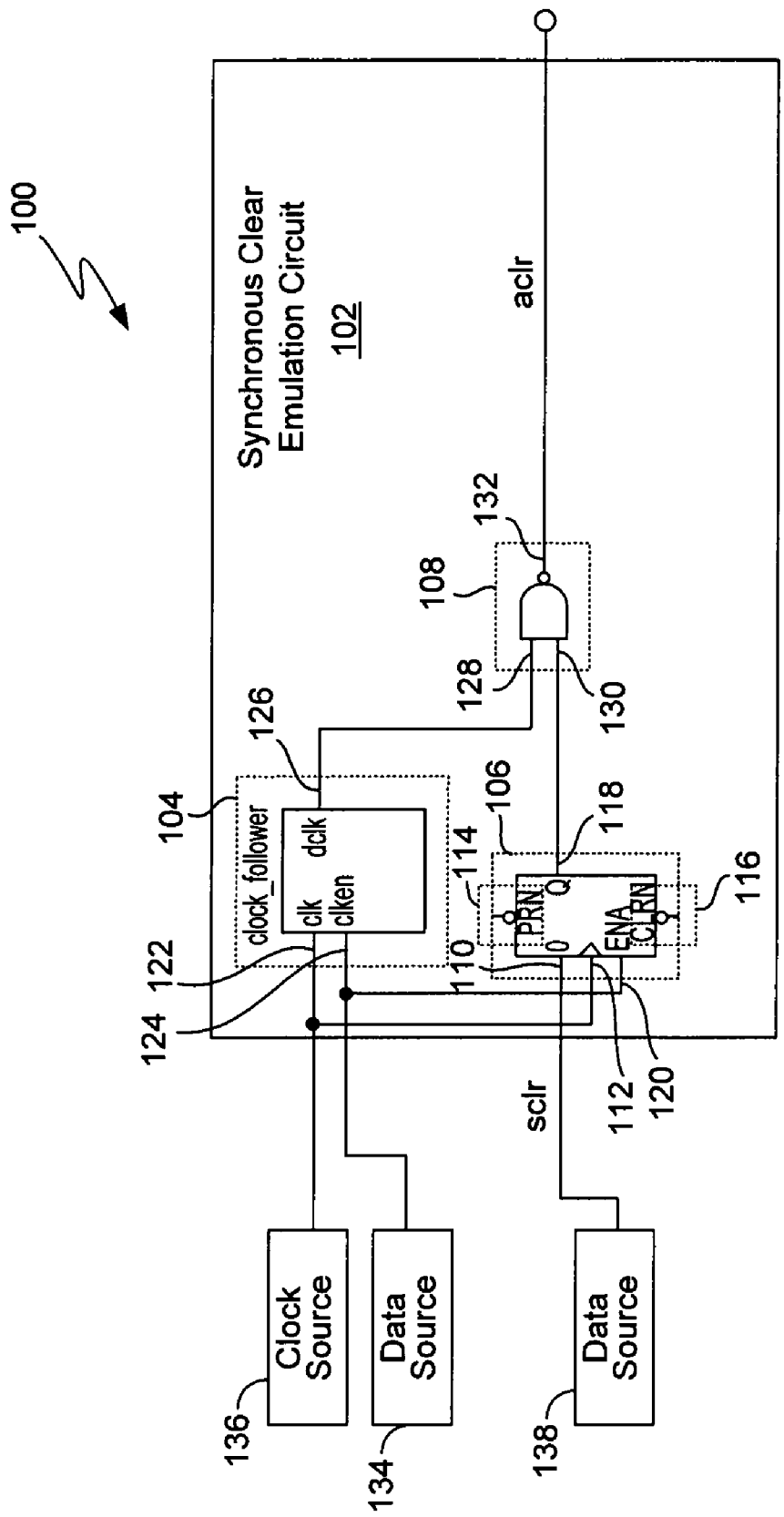
FIG. 1 is a circuit diagram of a system for emulating a synchronous clear port.
Figure 2:
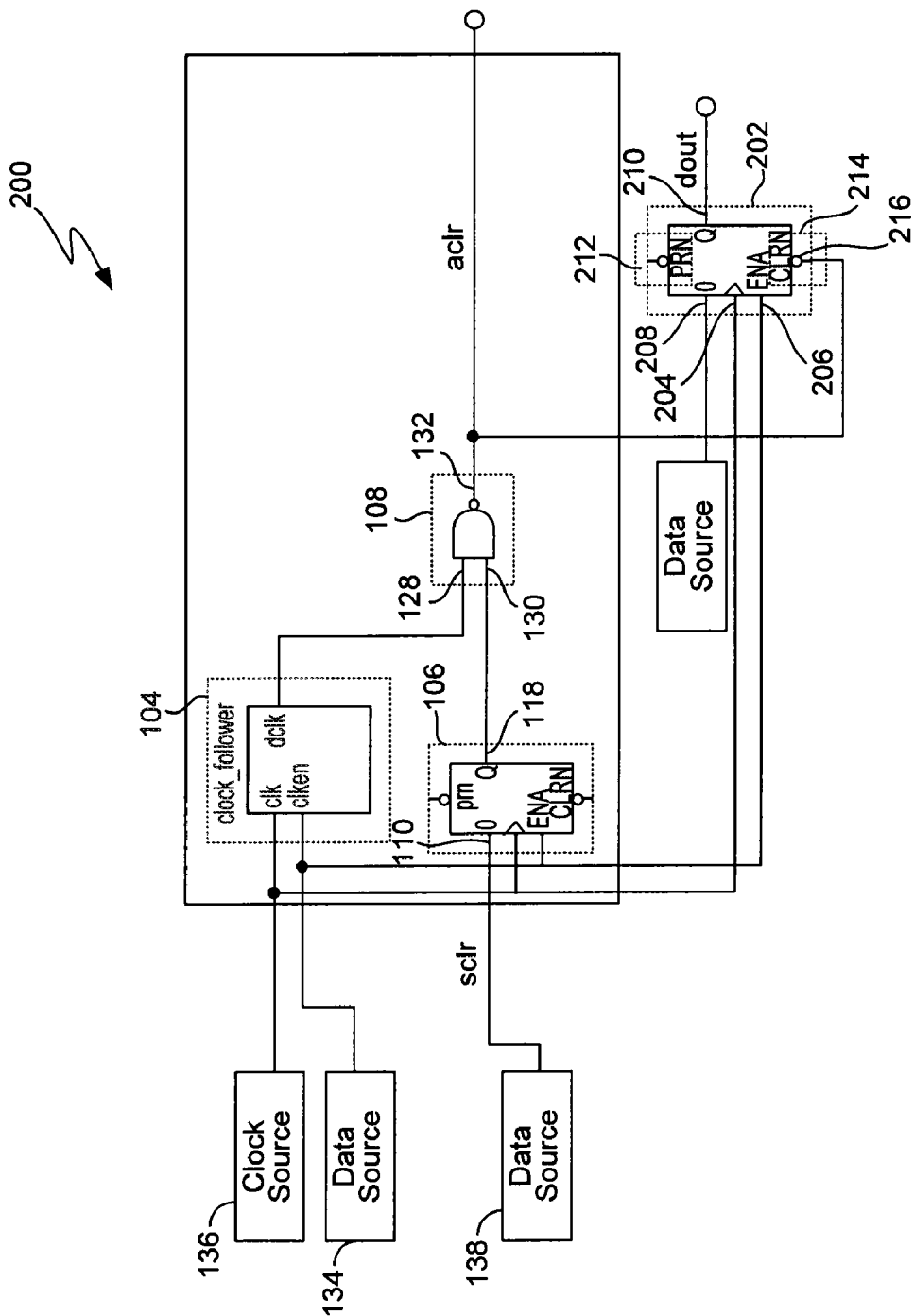
FIG. 2 is a circuit diagram of another embodiment of a system for emulating a synchronous clear port.
Figure 3:
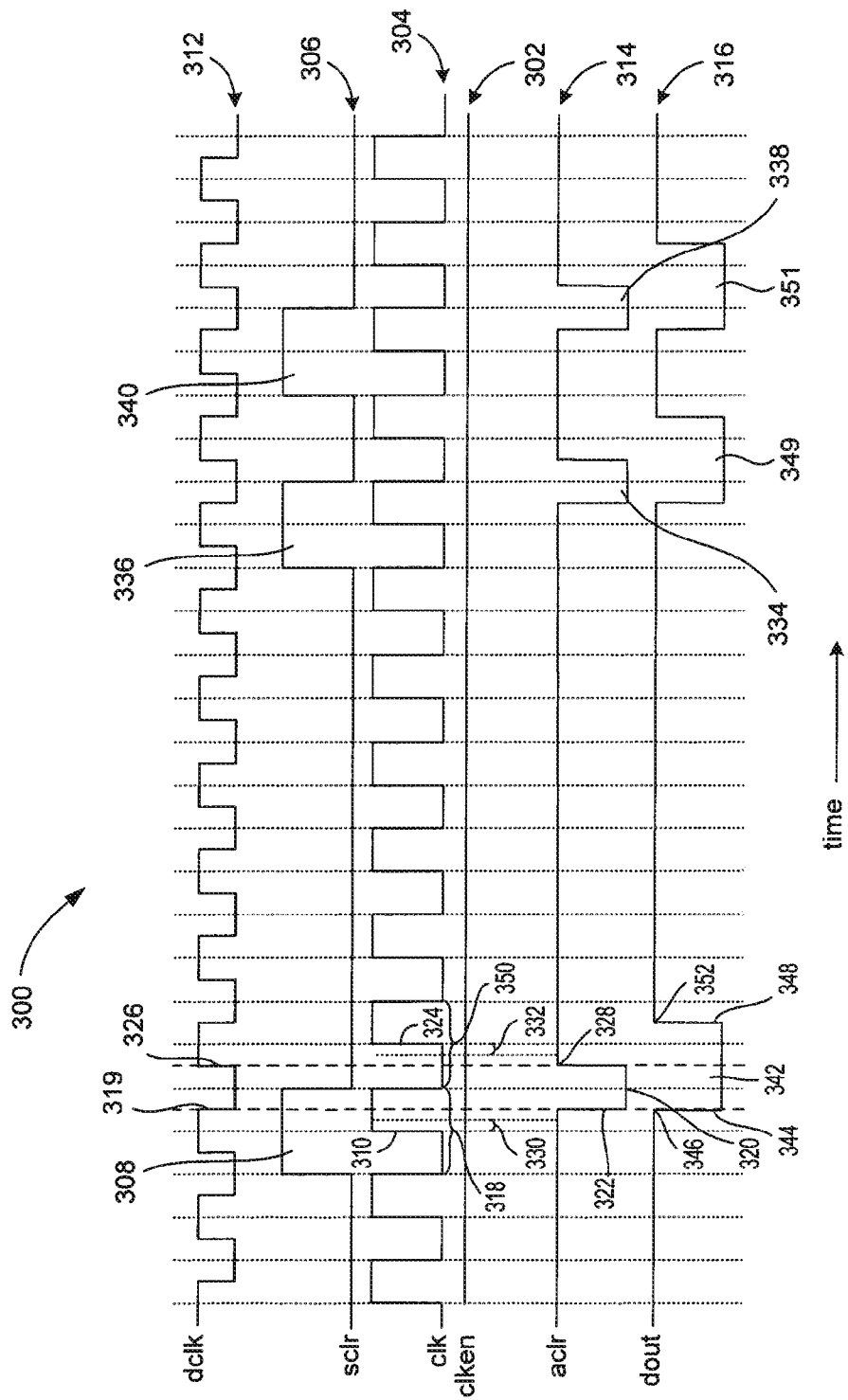
FIG. 3 is a timing diagram illustrating a method executed by using the system of FIG. 2.

FIG. 1 is a circuit diagram of a system 100 for emulating a synchronous clear port, FIG. 2 is a circuit diagram of another embodiment of a system 200 for emulating a synchronous clear port, and FIG. 3 is a timing diagram 300 illustrating a function of the system of FIG. 2. System 100 includes a synchronous clear emulation circuit 102.

Synchronous clear emulation circuit 102 includes a clock follower 104, a register 106, and a NAND gate 108. Register 106 is a D type flip-flop. Register 106 includes a data input 110, a clock input 112, a set input 114 (PRN), a reset input 116 (CLRN), a data output 118, and clock enable input 120. A reset input, as described herein, of a register is an asynchronous clear port of the register. A reset input includes a NOT gate.

Clock follower 104 includes a clock input 122, a clock enable input 124, and a delayed clock output 126. NAND gate 108 includes a NAND gate input 128, another NAND gate input 130, and a NAND gate output 132. A data source 134, such as a pulse generator, of system 100 supplies a clock enable signal 302 (FIG. 3) to clock enable input 124 of clock follower 104. A clock source 136, such as a phase locked loop (PLL) or a crystal oscillator, that generates a clock signal 304 (FIG. 3), supplies the clock signal 304 to clock input 112 and clock input 122. Clock enable input 120 is connected to clock enable input 124. A data source 138, such as a pulse generator, supplies a synchronous clear signal 306 (FIG. 3) including a synchronous clear pulse 308 (FIG. 3) to data input 110 of register 106. Each signal, described herein, is a function.

Synchronous clear signal 306 is synchronous with clock signal 304. For example, during a clock cycle 318 (FIG. 3), of clock signal 304, in which synchronous clear pulse 308 (FIG. 3) of synchronous clear signal 306 remains generated and is applied to a register described herein, the synchronous clear pulse 308 clears data stored within the register at a time of occurrence of a rising edge 310 (FIG. 3) of the clock cycle 318 and does not clear the data before the occurrence of the rising edge 310 during the clock cycle 318.

Clock follower 104 receives clock signal 304 at clock input 122 and outputs a delayed clock signal 312 (FIG. 3) at delayed clock output 126 during a time clock enable signal 302 is asserted at clock enable input 124. During a time clock enable signal 302 is not asserted at clock enable input 124, clock follower 104 does not output delayed clock signal 312 at delayed clock output 126.

During a time clock enable signal 302 is asserted by data source 134 and clock signal 304 is received by register 114, the register 114 latches and outputs, at data output 118, a state of synchronous clear signal 306 received at data input 110 upon receiving an edge, such as a rising edge or a falling edge, of the clock signal 304. Moreover, during a time clock enable signal 302 is not asserted by data source 134, register 114 outputs, at data output 118, a preceding state of synchronous clear signal 306 received at data input 110. NAND gate 108 receives delayed clock signal 312 and an output signal output at data output 118 of register 114 to output an asynchronous clear signal 314 (aclr) (FIG. 3) at NAND gate output 132.

System 200 of FIG. 2 includes system 100 of FIG. 1 and a register 202. Register 202 includes a clock input 204, a clock enable input 206, a data input 208, a data output 210, a set input 212 (PRN), and a reset input 214 (CLRN). Reset input 214 includes an asynchronous clear port of register and the port includes a NOT gate 216. A data source 218, such as a pulse generator, supplies a data input signal to data input 208 of register 202. Register 202 receives, at clock input 204, clock signal 304 received by clock follower 104 and register 106. Register 202 also receives, at clock enable input 206, clock enable signal 302 received by clock follower 104 and register 106.

During a time clock enable signal 302 is asserted by data source 134 and clock signal 304 is received by register 202, the register 202 latches and outputs, at data output 210, a state of the data input signal received at data input 208 upon receiving an edge, such as a rising edge or a falling edge, of the clock signal 304. Moreover, during a time clock enable signal 302 is not asserted by data source 134, register 202 outputs, at data output 210, a preceding state of the data input signal received at data input 208. At a time a deassertion of asynchronous clear signal 314 is received from NAND gate output 132, register 202 clears a data output signal (dout) 316 output at data output 210.

With reference to FIG. 3, clock follower 104 delays clock signal 304 by a portion, such as half, one-third, or one-fourth, of a cycle of clock signal 304 to generate delayed clock signal 312. Clock enable signal 302 is asserted. Further, during a time synchronous clear signal 306 is deasserted by data source 138, the signal is latched and output at data output 118 of register 106. A deassertion is an off state. Moreover, during the time synchronous clear signal 306 is deasserted, regardless of the state of delayed clock signal 312, NAND gate 108 outputs, at NAND gate output 132, an on state of asynchronous clear signal 314. Reset input 214 of register 202 receives the on state of asynchronous clear signal 314, negates the on state to generate an off state, and data output signal 316 at data output 210 of the register 202 is not cleared by the off state. Until asynchronous clear signal 314 is deasserted to generate asynchronous clear pulse 320, register 202 outputs data at data output 210 based on data at data input 208.

At a time data source 138 asserts synchronous clear signal 306 supplied to data input 110 to generate synchronous clear pulse 308, data input 110 of register 106 receives the pulse. An assertion is an on state. Further, at a time rising edge 310 of clock cycle 318 of clock signal 304 is generated by clock source 136, register 106 latches synchronous clear pulse 308 and outputs the pulse at data output 118. Delayed clock signal 312 returns to an off state from an on state to generate a falling edge 319 of the delayed clock signal 312. At a time falling edge 319 of delayed clock signal 312 is generated, the state, which is an on state, of NAND gate input 128 is the same as that of delayed clock signal 312 and the state of NAND gate input 130 is also an on state, which is the same as that of synchronous clock pulse 308 of synchronous clock signal 304.

Upon receiving an on state at NAND gate input 128 and an ON state at NAND gate input 130, NAND gate 108 outputs an off state at NAND gate output 132 and the off state is indicated by an asynchronous clear pulse 320 of asynchronous clear signal 314. Asynchronous clear pulse 320 and asynchronous clear signal 314 are asynchronous with clock signal 304. For example, at a time of generation of a falling edge 322 of asynchronous clear pulse 320, data within register 202 is cleared by the pulse. Reset input 214 of register 202 receives the off state of asynchronous clear signal 314, negates the off state to generate an on state, and data that is output at data output 210 of the register 202 is cleared to a deassertion by the off state at a time of generation of falling edge of asynchronous clear pulse 320. During the clearance of data that is output at data output 210 of register 202, a falling edge 344 of a pulse 342 of data output signal 316 is output at data output 210 at a time 346 falling edge 322 of asynchronous clear pulse 320 is generated.

Further, at a time data source 138 deasserts synchronous clear pulse 308, data input 110 of register 106 receives the deassertion. A deassertion is an off state. Until an immediate next rising edge 324 of clock signal 304, the deassertion of synchronous clear pulse 308 is not output at data output 118 of register 106 and data that is output at the data output 118 remains in an on state, which is the state of the pulse.

Delayed clock signal 312 returns to an on state immediately after the off state to generate a rising edge 326 of the delayed clock signal 312. At a time rising edge 326 of delayed clock signal 312 is generated, the state of NAND gate input 128 is an off state, which is the same as that of delayed clock signal 312 and the state of NAND gate input 130 is the same as that of synchronous clear pulse 308, which is an on state. Upon receiving an off state at NAND gate input 128 and an on state at NAND gate input 130, NAND gate 108 outputs an on state at NAND gate output 132 to assert asynchronous clear signal 314 at a time 328.

Asynchronous clear signal 314 is deasserted after a hold time 330 generated after time at which rising edge 310 of clock signal 304 is generated, and the asynchronous clear signal 314 is asserted before a setup time 332 generated before a time rising edge 324 of clock signal 304 is generated. Rising edge 310 precedes rising edge 324. A race condition in which asynchronous clear pulse 320 extends across two consecutive clock cycles of clock signal 304 is prevented by generation of asynchronous clear pulse 320 after hold time 330 and assertion of asynchronous clear signal 314 before setup time 332. The hold time 330 is a hold time of register 208 and the setup time 332 is a setup time 332 of the register 208. Similarly, an asynchronous clear pulse 334 is generated from a synchronous clear pulse 336 and another asynchronous clear pulse 338 is generated from another synchronous clear pulse 340

Data output signal 316 is a synchronous clear signal 306 that is synchronous with clock signal 304. For example, during a time period in which pulse 342 of data output signal 316 is applied to a reset input of a register (not shown), such as a D type flip-flop, that is connected to data output 210, data within the register is not cleared until rising edge 324 of a clock cycle 350 of clock signal 304 occurs. Similarly, a plurality of pulses 349 and 351 are generated from corresponding pulses 334 and 338.

During a time in which asynchronous clear pulse 320 remains generated, register 202 does not output data at data output 210 regardless of data received at data input 208. At time 328 at which asynchronous clear signal 314 changes from an off state to an on state, register 202 holds the off state at reset input 214 until rising edge 324 of clock signal 304 is received by the register 202. After receiving rising edge 324, register 202 discontinues to hold the off state at reset input 214 at a time 352. After time 352, until another asynchronous clear pulse 334 is generated, register 202 outputs data at data output 210 of the register 202 based on data at data input 208 of the register 202.

In other embodiments, instead of a D type flip-flop, any register, described herein, may be a T type flip-flop, an SR type flip-flop, a JK type flip-flop, or any other type of flip flop.

Figure 4:
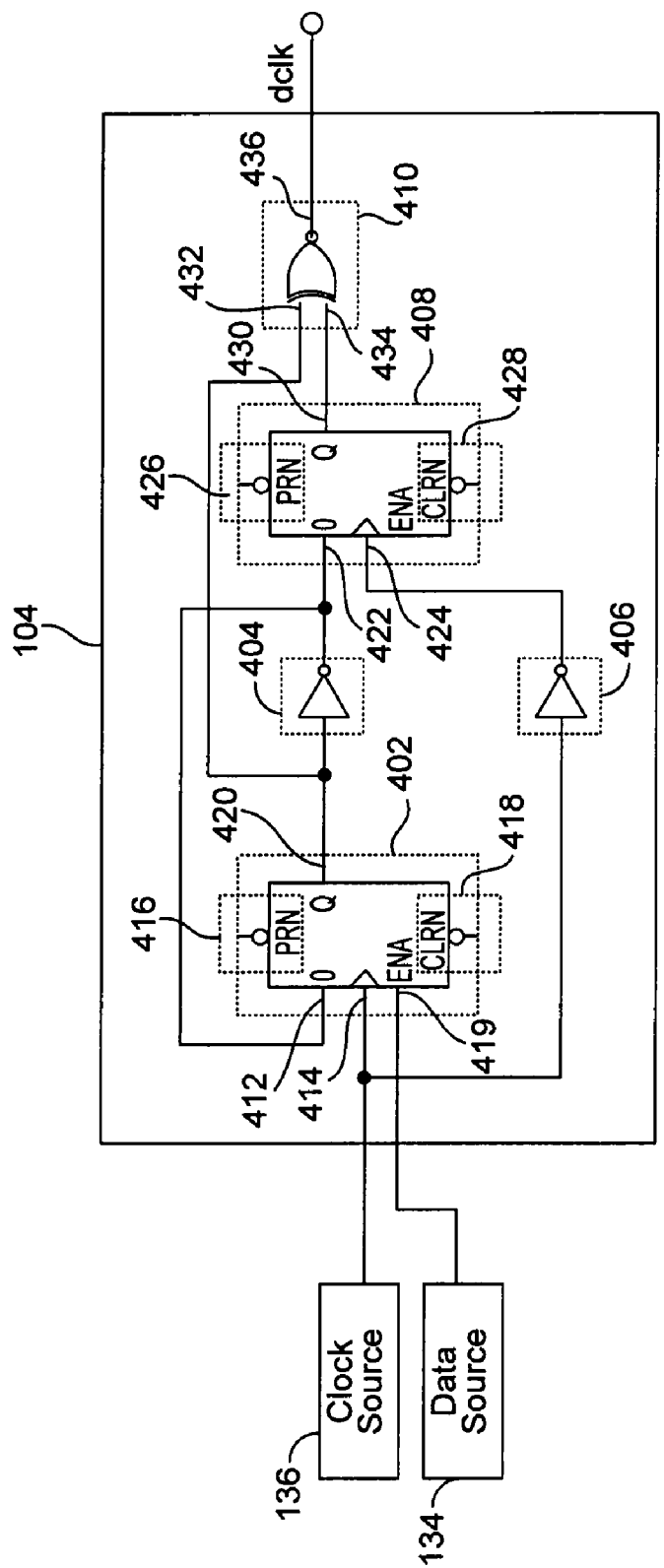
FIG. 4 is a circuit diagram of an embodiment of a clock follower used within the system of FIG. 1 to create a delayed clock signal.
Figure 5:
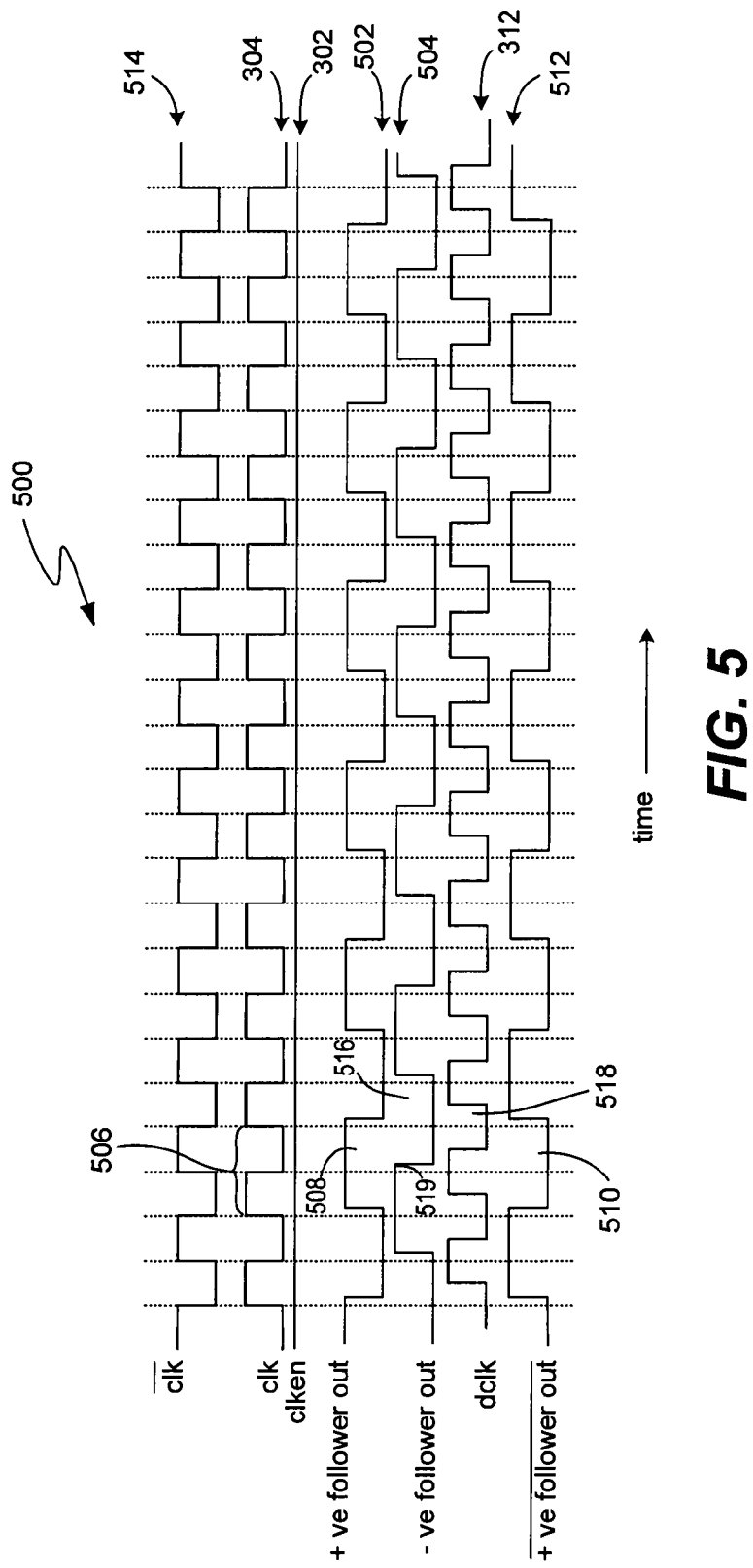
FIG. 5 is a timing diagram generated by using the clock follower of FIG. 4.

FIG. 4 is a circuit diagram of an embodiment of clock follower 104 and FIG. 5 is a timing diagram 500 generated by using the clock follower 104 of FIG. 4. Clock follower 104 includes a register 402, a NOT gate 404, another NOT gate 406, a register 408, and an XNOR gate 410. Register 402 includes a data input 412, a clock input 414, a set input (PRN) 416, a reset input (CLRN) 418, a clock enable input 419, and a data output 420. Data output 420 outputs a positive (+ve) follower output signal 502 (FIG. 5), which is synchronous to a rising edge of clock signal 304.

Register 408 includes a data input 422, a clock input 424, a set input 426 (PRN), a reset input 428 (CLRN), and a data output 430. Data output 430 outputs a negative (−ve) follower output signal 504, which is synchronous with a falling edge of clock signal 304. Clock input 424 receives a negation of clock signal 304 received by clock input 414. This negation of clock signal 304 does not gate the clock signal 304. Accordingly, the negation of clock signal 304 does not generate a gated clock signal 304. Generally, a gated clock signal 304 may add clock skew in an integrated circuit, such as a programmable logic device (PLD) or a field programmable gate array (FPGA), and the clock skew generates incorrect results in a static timing analysis performed for developing the integrated circuit.

XNOR gate 410 includes an XNOR gate input 432 that receives positive follower output signal 502. XNOR gate 410 includes another XNOR gate input 434 that receives negative follower output signal 504. Delayed clock signal 312 is output at an XNOR gate output 436 of XNOR gate 410. XNOR gate output 436 is directly connected to NAND gate input 128.

Data input 412 of register 402 is initiated with a pulse, such as a one or a zero. At a time clock enable signal 302 is asserted by data source 134 and clock source 136 supplies clock signal 304 to clock input 136 of register 416, data, such as a pulse, that is input at data input 412 of the register 416 is latched and output at data output 420 of the register 402 during a clock cycle 506 of the clock signal 304 to generate a pulse 508 of positive follower output signal 502. Similarly, the remaining pulses, shown in FIG. 5, of positive follower output signal 502 are generated via NOT gate 404 and register 402.

NOT gate 404 negates pulse 508 of positive follower output signal 502 that is output at data output 420 during clock cycle 506 of clock signal 304 to generate a pulse 510 of an inverted positive follower output signal (+vefolloweroutputsignal) 512 that is input at data input 412 of register 402 during the clock cycle. NOT gate 404 facilitates the state of positive follower output signal 402 to be different than the state of negative follower output signal 504 during a time clock signal 304 is deasserted. Further, NOT gate 404 facilitates the state of positive follower output signal 402 to be the same as that of negative follower output signal 504 during a time clock signal 304 is asserted.

Register 408 receives, at clock input 424, an inverted clock signal 514, which is a negation of clock signal 304. Register 408 receives inverted positive follower output signal 512, which is a negation of positive follower output signal 502, from NOT gate 404. Data, such as pulse 510 of inverted positive follower output signal 512, that is input at data input 422 of register 408 is latched and output at data output 430 of the register 408 to generate a pulse 516 of negative follower output signal 504. Similarly, the remaining pulses, shown in FIG. 5, of negative follower output signal 504 are generated.

XNOR gate 410 receives pulse 508 of positive follower output signal 502 at XNOR gate input 432 and pulse 516 of negative follower output signal 504 at XNOR gate input 434, and performs an XNOR operation on the two pulses to output a pulse 518 of delayed clock signal 312 at XNOR gate output 436. For example, upon generation of pulse 516 of negative follower output signal 504 at a time 519, pulse 508 of positive follower output signal 502 is an assertion and pulse 516 of negative follower output signal 504 is a deassertion. In this example, XNOR gate 410 performs an XNOR operation on the assertion and the deassertion to generate a deassertion, which is pulse 518 of delayed clock signal 312. Similarly, the remaining pulses, shown in FIG. 5, of delayed clock signal 312 are output at XNOR gate output 436.

In other embodiments, instead of a D type flip-flop, any register may be a T type flip-flop, an SR type flip-flop, a JK type flip-flop, or any other type of flip flop.

Figure 6:
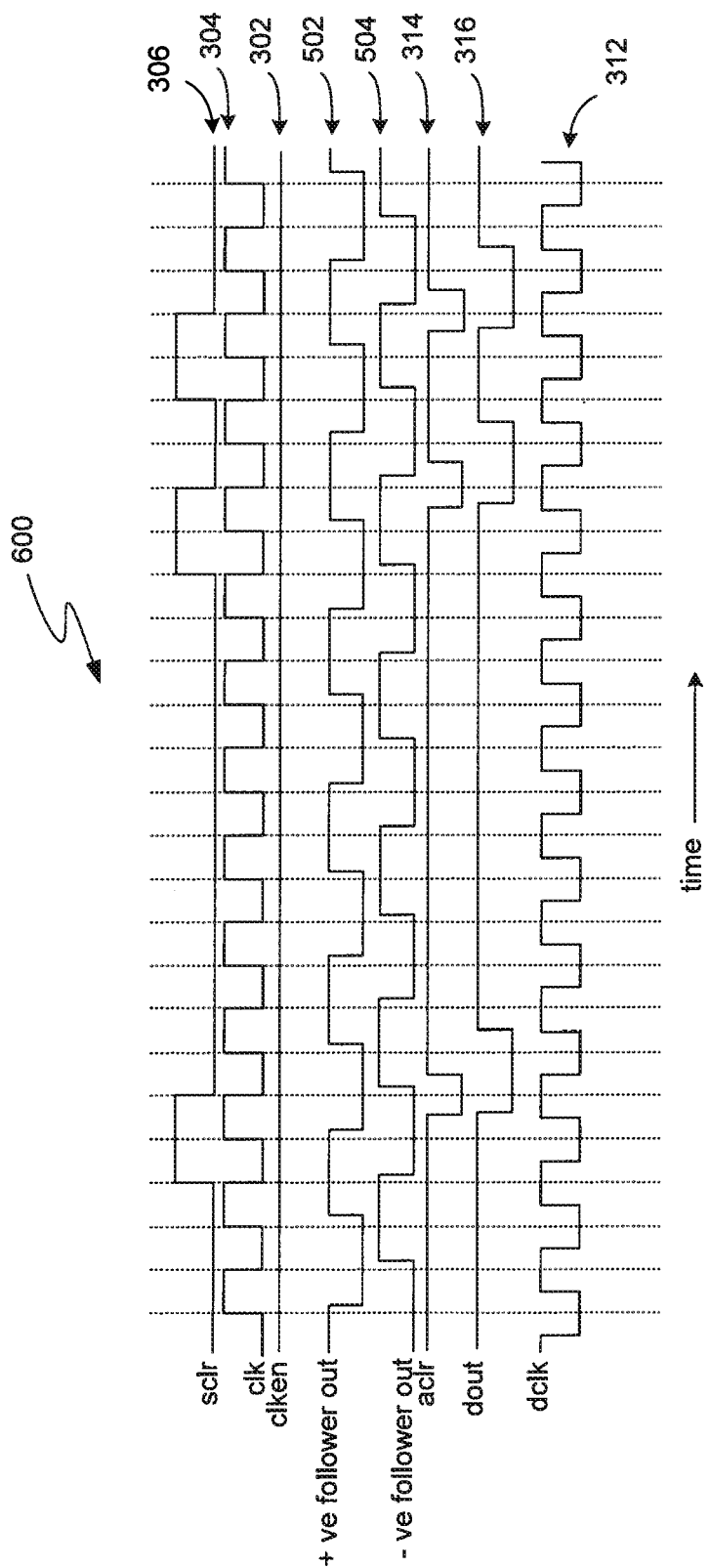
FIG. 6 is a timing diagram illustrating a method for emulating a synchronous clear port.

FIG. 6 is a timing diagram 600 of an embodiment of a method for emulating a synchronous clear signal 306. Timing diagram 600 combines several signals of the timing diagrams 300 and 500 of FIGS. 3 and 5 into single timing diagram. For example, timing diagram 600 shows synchronous clear signal 306, clock enable signal 302, asynchronous clear signal 314, and data output signal 316 of FIG. 2 in a timeline with positive follower output signal 502 and negative follower output signal 504 of FIG. 5 to generate timing diagram 600.

Figure 7:
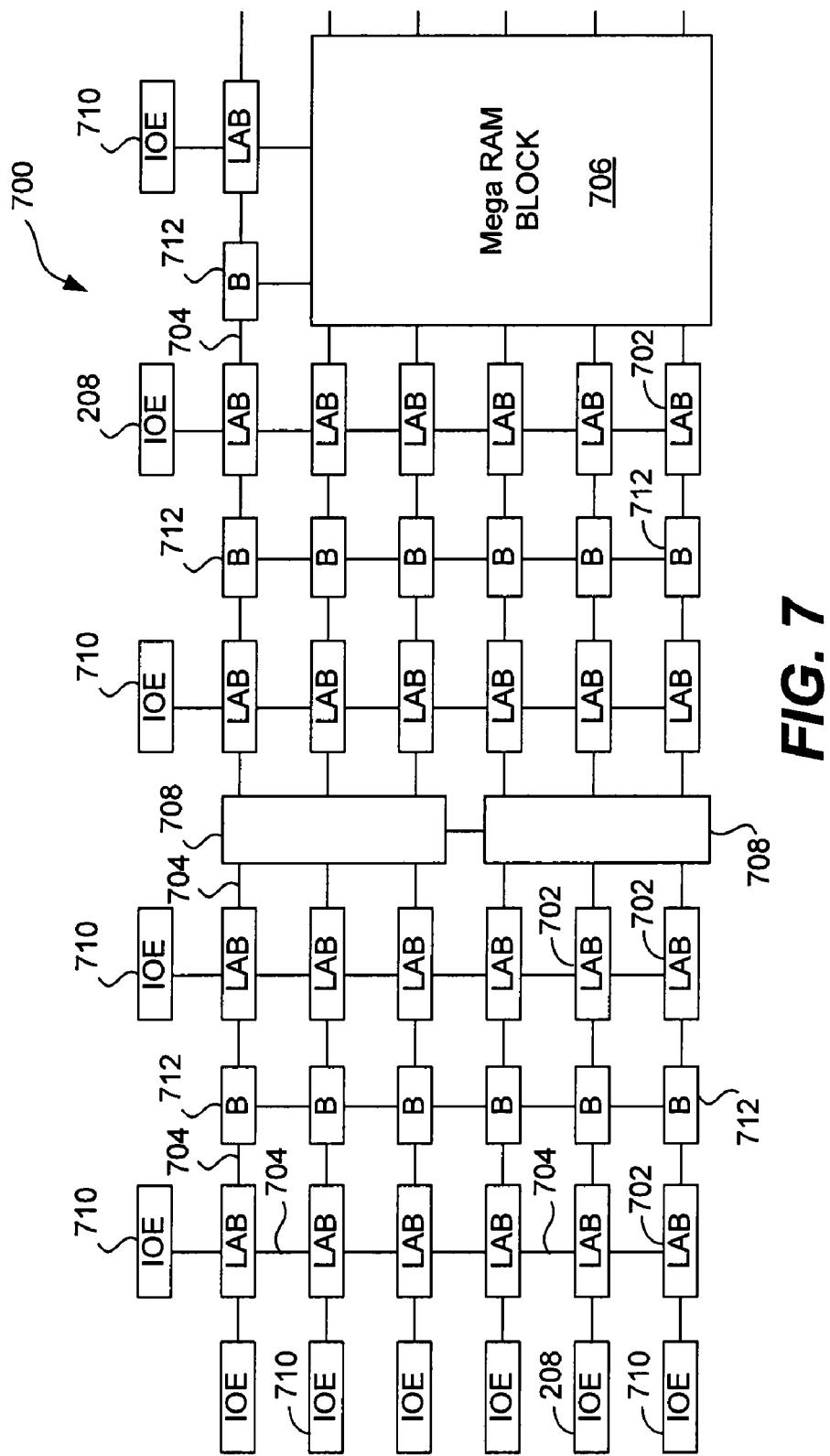
FIG. 7 is a block diagram of an embodiment of an integrated circuit that is configured by using the circuit of FIG. 1.
Figure 8:
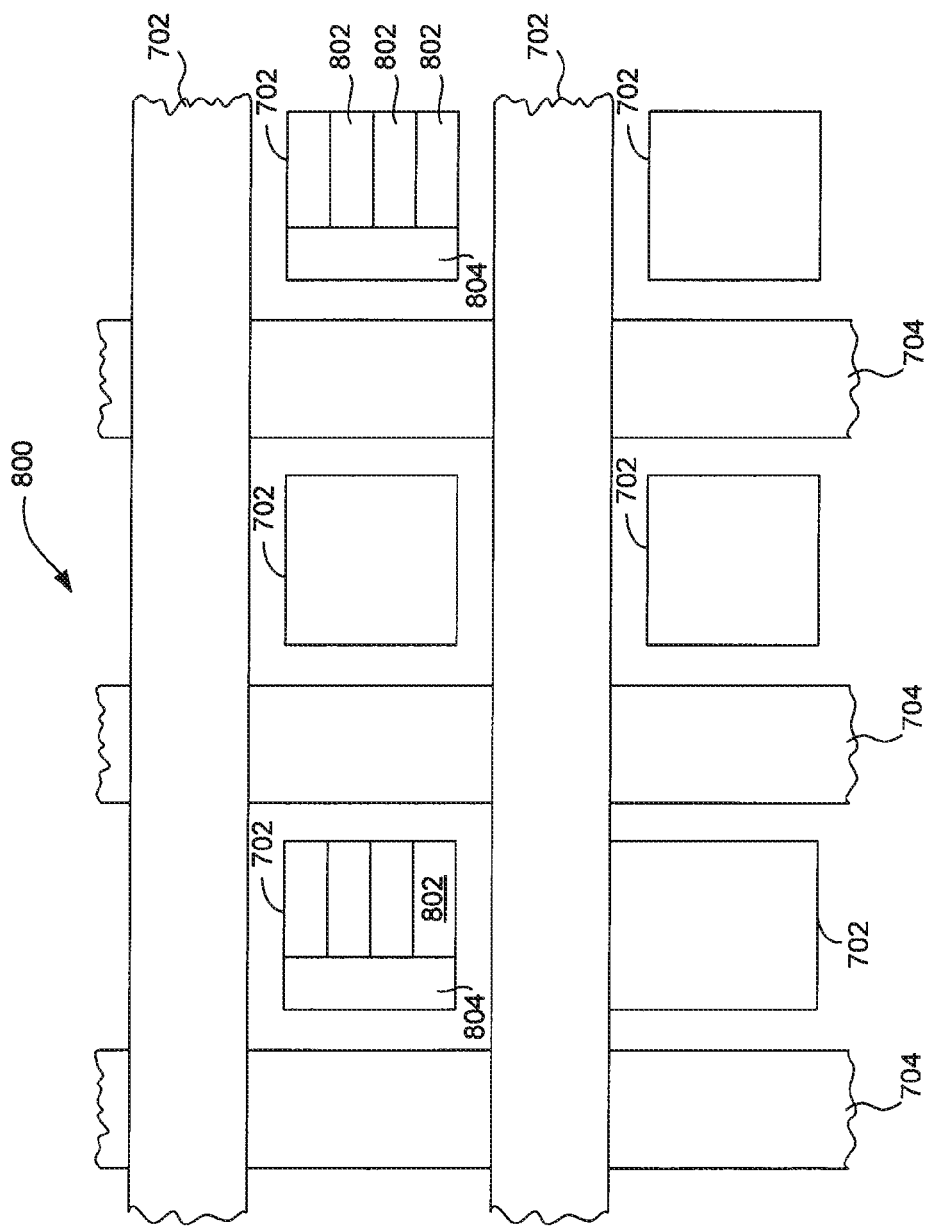
FIG. 8 is a block diagram of an embodiment of at least a portion of the integrated circuit of FIG. 7.

FIG. 7 is a block diagram of an embodiment of an integrated circuit 700 that is configured by using circuit of FIG. 1. FIG. 8 is a block diagram of an embodiment of at least a portion 800 of integrated circuit 700. Integrated circuit 700 includes a two-dimensional array of programmable logic array blocks (LABs) 702 that are interconnected by a network of a plurality of row interconnects 704 and a plurality of column interconnects 706 of varying length and speed. For the purpose of avoiding clutter in FIG. 7, not all LABs shown in the Figure are numbered 702. LABs 702 include multiple logic elements 802 (LEs) (shown in FIG. 8). integrated circuit 700 also includes a distributed memory structure including a plurality of random access memory (RAM) blocks of varying sizes provided throughout the array. The RAM blocks include, for example, a MegaRAM block 706 and/or a RAM block, which stores less information than the MegaRAM block 706. integrated circuit 700 further includes a plurality of digital signal processing (DSP) blocks 708 that can implement, for example, multipliers, add features, and/or subtract features. A plurality of input/output (I/O) elements (IOEs) 710 located around the periphery of integrated circuit 700 support numerous single-ended and differential I/O standards. An example of IOE 710 includes a transceiver. integrated circuit 700 further includes a plurality of buffers (Bs) 712 that connect LABs 702. Buffers 712 may be used to store data that is transferred between LABs 702.

Register 202 (FIG. 2) is located within DSP block 708 and system 100 is located within integrated circuit 700. Referring to FIG. 8, integrated circuit 700 includes LEs 802, a plurality of sets 804 of LAB lines, and LABs 702. LEs 802 of LAB 702 are connected to each other via set 804 of LAB lines. The LAB lines of set 804 within LAB 702 connect to LEs 802 of the LAB 702.

In another embodiment, integrated circuit 700 includes any number of LABs 702. In yet another embodiment, integrated circuit 700 does not include buffers 712 and data is directly transferred between LABs 702 without being stored in the buffers 712. In still another embodiment, buffers 712 are included for storage of data transferred between some of the LABs 702 and data is directly transferred between the remaining LABs 702 without being stored in buffers 712. In other embodiments, register 202 is located within MegaRAM block 706 or one of the RAM blocks of integrated circuit 700. In other embodiments, register 202 is located within some DSP blocks 708 and not located within the remaining DSP blocks 708 of integrated circuit 700. In yet other embodiments, register 202 is located within any, some, or all IOEs 710.

It is noted that in other embodiments, register 202 may be implemented within any integrated circuit, such as within a DSP block of field programmable gate arrays (FPGAs) of Stratix™ family manufactured by Altera™ Corporation. It is further noted that instead of a rising edge of clock signal 304, a falling edge of the clock signal can be used. For example, positive follower output signal 502 is synchronous to a falling edge of clock signal 304 instead of a rising edge of clock signal. As another example, negative follower output signal 504 is synchronous with a rising edge of clock signal 304 instead of a falling edge of the clock signal. As yet another example, registers 106, 202, and 402 latch and output data synchronous with a falling edge of clock signal 304 instead of with a rising edge of the clock signal.

Technical effects of the herein described systems and techniques include generating data output signal 316, which is a synchronous clear signal, from asynchronous clear signal 314 without using a synchronous clear port of register 202 and by using the asynchronous clear port of the register 202. Because a synchronous clear signal is generated by using the asynchronous clear port of register 202 and without using a synchronous clear port of the register 202, the asynchronous clear port emulates the synchronous clear port. Data output signal 316 is synchronous with clock signal 304. Some integrated circuits, such as an FPGA in a Stratix™ family of FPGAs manufactured by Altera™ Corporation, include an asynchronous clear port and do not include a synchronous clear port. The generation of data output signal 316 via the asynchronous clear port of register 202 saves the time and cost of adding a synchronous clear port to the register while achieving the functionality of the synchronous clear port. Synchronous clear emulation circuit 102 provides functionality of the synchronous clear port to these integrated circuits by generating data output signal 316, which is a synchronous clear signal, received via an asynchronous clear port, such as reset input 214.

Other technical effects include preventing the race condition and preventing generation of the gated clock signal. For example, if clock source 136 (FIG. 1) is directly connected to NAND gate input 128, NAND gate output 132 outputs a gated clock signal. By using clock follower 104 between clock source 136 and NAND gate input 128, the generation of a gated clock signal is prevented.

Although the foregoing systems and techniques have been described in detail by way of illustration and example for purposes of clarity and understanding, it will be recognized that the above described systems and techniques may be embodied in numerous other specific variations and embodiments without departing from the spirit or essential characteristics of the systems and techniques. Certain changes and modifications may be practiced, and it is understood that the systems and techniques are not to be limited by the foregoing details, but rather is to be defined by the scope of the appended claims.

What is claimed is:

1. A synchronous clear emulation circuit comprising:
    a first register configured to receive a synchronous clear signal, and further configured to generate an output based on the synchronous clear signal;
    a clock follower circuit operative to generate a delayed clock signal, wherein the delayed clock signal is a clock signal that is delayed by at least a portion of a clock cycle; and
    a combinational circuit operative to combine the output of the first register with the delayed clock signal to generate an asynchronous clear signal, wherein the asynchronous clear signal is operative to synchronously clear a second register via an asynchronous clear port.

2. A synchronous clear emulation circuit in accordance with claim 1, wherein the second register includes the asynchronous clear port and lacks a synchronous clear port, and wherein said synchronous clear emulation circuit is configured to supply the asynchronous clear signal to said asynchronous clear port.

3. A synchronous clear emulation circuit in accordance with claim 2, wherein said second register is configured to receive an input clock signal, wherein the asynchronous clear signal includes an asynchronous clear pulse generated after a hold time generated after a first edge of the clock signal and before a setup time generated before a second edge of the clock signal, wherein the first edge precedes the second edge, wherein the second edge is a rising edge if the first edge is a rising edge, and the second edge is a falling edge if the first edge is a falling edge.

4. A synchronous clear emulation circuit in accordance with claim 3, wherein said second register is configured to receive a negation of the asynchronous clear signal, wherein the negation is input to said second register to clear said second register synchronously with the input clock signal.

5. A synchronous clear emulation circuit in accordance with claim 1, wherein the second register includes the asynchronous clear port configured to receive the asynchronous clear signal and is operative to generate an output signal based on the asynchronous clear signal.

6. A synchronous clear emulation circuit in accordance with claim 1, wherein the clock follower circuit is configured to receive an input clock signal and generate the delayed clock signal based on the input clock signal, and wherein the delayed clock signal includes a delay added to the input clock signal.

7. A synchronous clear emulation circuit in accordance with claim 1, wherein the combination circuit comprises a gate coupled to said clock follower circuit and to said first register, wherein said gate is configured to receive the delayed clock signal and a data output from said first register to output the asynchronous clear signal.

8. A synchronous clear emulation circuit in accordance with claim 6, wherein said clock follower circuit comprises:
    a third register having a data output that outputs a first data signal;
    a fourth register having a data input that receives a second data signal; and
    a first NOT gate that receives the first data signal to generate the second data signal.

9. A synchronous clear emulation circuit in accordance with claim 8, wherein said clock follower circuit comprises a second NOT gate that negates the input clock signal to generate an inverted clock signal, wherein said fourth register receives the inverted clock signal.

10. A synchronous clear emulation circuit in accordance with claim 9, wherein the inverted clock signal is not a gated clock signal.

11. A synchronous clear emulation circuit comprising:
a first register configured to receive a synchronous clear signal, and further configured to generate an output based on the synchronous clear signal;
a clock follower circuit operative to generate a delayed clock signal, wherein the delayed clock signal is a clock signal that is delayed by at least a portion of a clock cycle;
a combinational circuit operative to combine the output of the first register with the delayed clock signal to generate an asynchronous clear signal; and
a second register including an asynchronous clear port, wherein the asynchronous clear signal is operative to synchronously clear the second register via the asynchronous clear port.

12. A synchronous clear emulation circuit in accordance with claim 11, wherein said synchronous clear emulation circuit is implemented within a digital signal processor.

13. A synchronous clear emulation circuit in accordance with claim 12, wherein said digital signal processor is implemented within a field programmable gate array.

14. An integrated circuit comprising:
a synchronous clear emulation circuit including:
a first register configured to receive a synchronous clear signal, and further configured to generate an output based on the synchronous clear signal;
a clock follower circuit operative to generate a delayed clock signal, wherein the delayed clock signal is a clock signal that is delayed by at least a portion of a clock cycle; and
a combinational circuit operative to combine the output of the first register with the delayed clock signal to generate an asynchronous clear signal, wherein the asynchronous clear signal is operative to synchronously clear a second register via an asynchronous clear port.

15. An integrated circuit in accordance with claim 14, further comprising a digital signal processor including said synchronous clear emulation circuit, wherein said synchronous clear emulation circuit includes the second register having the asynchronous clear port, wherein said synchronous clear emulation circuit is configured to supply the asynchronous clear signal to said asynchronous clear port, and wherein said digital signal processor is included in a field programmable gate array, a programmable logic device, or an application specific integrated circuit.

16. An integrated circuit in accordance with claim 15, wherein said second register is configured to receive an input clock signal, wherein the asynchronous clear signal includes an asynchronous clear pulse generated after a hold time generated after a first edge of the clock signal and before a setup time generated before a second edge of the clock signal, wherein the first edge precedes the second edge, wherein the second edge is a rising edge if the first edge is a rising edge, and the second edge is a falling edge if the first edge is a falling edge.

17. A synchronous clear emulation method comprising:
receiving a synchronous clear signal;
generating a delayed clock signal, wherein the delayed clock signal is a clock signal that is delayed by at least a portion of a clock cycle; and
generating an asynchronous clear signal by combining an output of a first register with the delayed clock signal, wherein the asynchronous clear signal is operative to synchronously clear a second register via an asynchronous clear port.

18. A synchronous clear emulation method in accordance with claim 17 further comprising supplying the asynchronous clear signal to said asynchronous clear port; and generating a signal based on the asynchronous clear signal.

19. A synchronous clear emulation method in accordance with claim 18, further comprising:
receiving an input clock signal;
generating a hold time after a first edge of the input clock signal;
generating a setup time before a second edge of the input clock signal; and
generating an asynchronous clear pulse of the asynchronous clear signal after the hold time and before the setup time, wherein the first edge precedes the second edge, wherein the second edge is a rising edge if the first edge is a rising edge, and the second edge is a falling edge if the first edge is a falling edge.

20. A synchronous clear emulation method in accordance with claim 18, further comprising:
receiving a negation of the asynchronous clear signal; and
clearing the second register including the asynchronous clear port synchronously with an input clock signal at the time of the reception of the negation.

21. A synchronous clear emulation system comprising:
means for receiving a synchronous clear signal;
means for generating a delayed clock signal, wherein the delayed clock signal is a clock signal that is delayed by at least a portion of a clock cycle;
means for generating an asynchronous clear signal by combining an output of a first register with the delayed clock signal; and
means for clearing a register asynchronously with an input clock signal.

22. A synchronous clear emulation system in accordance with claim 21 further comprising:
means for supplying the asynchronous clear signal to a second register; and
means for generating an output at the second register based on the asynchronous clear signal.

23. A synchronous clear emulation system in accordance with claim 22, further comprising:
means for receiving the input clock signal;
means for generating a hold time after a first edge of the input clock signal;
means for generating a setup time before a second edge of the input clock signal;
means for generating an asynchronous clear pulse of the asynchronous clear signal after the hold time and before the setup time, wherein the first edge precedes the second edge, wherein the second edge is a rising edge if the first edge is a rising edge, and the second edge is a falling edge if the first edge is a falling edge.

* * * * *